United States Patent [19]

Yariv et al.

[11] Patent Number: 5,054,040

[45] Date of Patent: Oct. 1, 1991

[54] NON-DESTRUCTIVE CHARGE DOMAIN MULTIPLIER AND PROCESS THEREOF

[75] Inventors: Amnon Yariv, San Marino; Charles T. Neugebauer; Aharon J. Agranat, both of Pasadena, all of Calif.

[73] Assignee: California Institute of Technology, Pasadena, Calif.

[21] Appl. No.: 534,250

[22] Filed: Jun. 7, 1990

[51] Int. Cl.$^5$ .................... G11C 19/28; H01L 29/78
[52] U.S. Cl. ........................................ 377/60; 357/24
[58] Field of Search ...................... 357/24; 377/57-63

[56] References Cited

U.S. PATENT DOCUMENTS

| | | | |
|---|---|---|---|
| 4,040,077 | 8/1977 | Tehon | 357/24 |
| 4,047,051 | 9/1977 | Heller | 357/24 |
| 4,239,983 | 12/1980 | Edwards et al. | 357/24 |
| 4,486,893 | 12/1984 | Carrison | 357/24 |

OTHER PUBLICATIONS

Sequin et al., *Charge Transfer Devices*, Academic Press, N.Y., 1975, pp. 80-91.

*Primary Examiner*—Gene M. Munson
*Attorney, Agent, or Firm*—Leonard Tachner

[57] ABSTRACT

A non-destructive charge domain multiplier and process thereof wherein the unique characteristics of the charge coupled device permits sensing the size of the charge packet as it moves past an electrode and creating a new charge packet proportional to the product of the original packet and an externally applied value. The device non-destructively senses the size of the charge packet and multiplies it with another value using a multiple metering gate variation of the "Fill and Spill" technique. The present invention therefore constitutes a unique CCD configuration which creates as an output, a charge packet proportional to the product of the charge in an input packet and an externally applied value. Thus, the present invention enables the performance of non-linear operations by CCD integrated circuits.

9 Claims, 4 Drawing Sheets

NON-DESTRUCTIVE CHARGE DOMAIN MULTIPLIER AND PROCESS THEREOF

ORIGIN OF INVENTION

This invention was made with Government support under F49620-88-C-0112 awarded by the Air Force. The Government has certain rights in this invention.

TECHNICAL FIELD

The present invention relates generally to charge domain devices and more specifically to a charge coupled device configuration which creates as an output, a charge packet proportional to the product of an input charge packet and an external logical value for enabling non-linear operations by CCD integrated circuits.

BACKGROUND ART

A charge coupled device or CCD storage line contains charge packets beneath electrodes, typically made of polysilicon. Each charge packet is proportional to an analog value and can be spatially transferred between adjacent electrodes by raising the voltage of the destination electrode. Thus, by sequentially pulsing adjacent electrodes, a series of charge packets can be moved along the storage line in a sequential manner, much like a binary shift register, but in this case the charges being moved are multi-valued or analog.

The manner of shifting charge packets between electrodes of a charge coupled device is discussed at length in the literature and therefore need not be disclosed herein in any detail. By way of example, the textbook entitled Microelectronics "Digital and Analog Circuits and Systems", Jacob Millman, copyright 1979, McGraw Hill, Inc. discusses charge coupled devices beginning at page 298 and specifically discusses the polysilicon electrode structure for a four phase shift register beginning at page 306. Other references relating to charge-coupled devices include: ChargeTransfer Devices by G. S. Hobson (1978, Edward Arnold, Ltd.); Charge-Coupled Devices and Their Applications by Beynon and Lamb (1980, McGraw-Hill); and Charge-Coupled Devices: Technology and Applications by Melen and Buss (1977, IEEE Press).

Such prior art disclosures of charge coupled devices generally relate to their use as binary shift registers or other forms of memory storage devices. However, charge coupled devices can also be used for other purposes, such as specialized signal processors. Thus, for example, in an article entitled "A One Hundred Nanosecond Sixteen-Point CCD Cosine Transform Processor" by Chiang et al, MIT Lincoln Laboratory, Lexington, Mass., published at page 306 of the 1987 IEEE International Solid State Circuits Conference Digest of Technical Papers, the authors describe the use of charge coupled devices as fixed weight multipliers for use as a vector-matrix product device.

Signal processing systems typically contain several basic building blocks. Filter coefficients require memory, time varying signals are often sampled, delayed, and then processed. Charge domain devices offer unique properties to signal processing systems that are inefficiently implemented in other technologies. Short term (tens of milliseconds), high quality analog storage, simple analog delay lines, and low power/area requirements typify CCD signal processors. CCD's, however are not ideal. Signal processing systems often require a signal value to be multiplied by a variable coefficient value, something that has not been easily done with CCD's.

SUMMARY OF THE INVENTION

The present invention comprises a non-destructive charge domain multiplier and process thereof wherein the unique characteristics of the charge coupled device permits sensing the size of the charge packet as it moves past an electrode and creating a new charge packet proportional to the product of the original packet and an externally applied logical value. The device non-destructively senses the size of the charge packet and multiplies it with another value using a multiple metering gate variation of the "Fill and Spill" technique. The fill and spill method of inputting charge in a charge-coupled device (also known as "potential equalization" or "charge preset") is described beginning at page 187 in the aforementioned reference by Beynon and Lamb. The present invention therefore constitutes a unique CCD configuration which creates as an output, a charge packet proportional to the product of the charge in an input packet and an externally applied value. Thus, the present invention enables the performance of non-linear operations by CCD integrated circuits.

OBJECTS OF THE INVENTION

It is therefore a principal object of the present invention to provide a non-destructive charge domain multiplier comprising a charge coupled device uniquely configured to provide an output charge which is proportional to the product of an input charge and an externally applied value.

It is an additional object of the present invention to provide a charge coupled device configured for sensing the size of a charge packet as it is moved past an electrode and to create a new charge packet which is proportional to the product of the original charge packet and an externally applied value.

It is still an additional object of the present invention to provide a unique charge coupled device integrated circuit capable of performing non-linear operations such as the multiplication of one analog value by another, the first such analog value being in the form of a charge packet and the other being in the form of a set of applied voltages, the multiplication process being performed using a multiple metering gate variation of the well-known "Fill and Spill" technique in charge coupled device technology.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment of the invention when taken in conjunction with the following drawings in which.

DETAILED DESCRIPTION OF A PREFERRED EMBODIMENT

Figure 1:
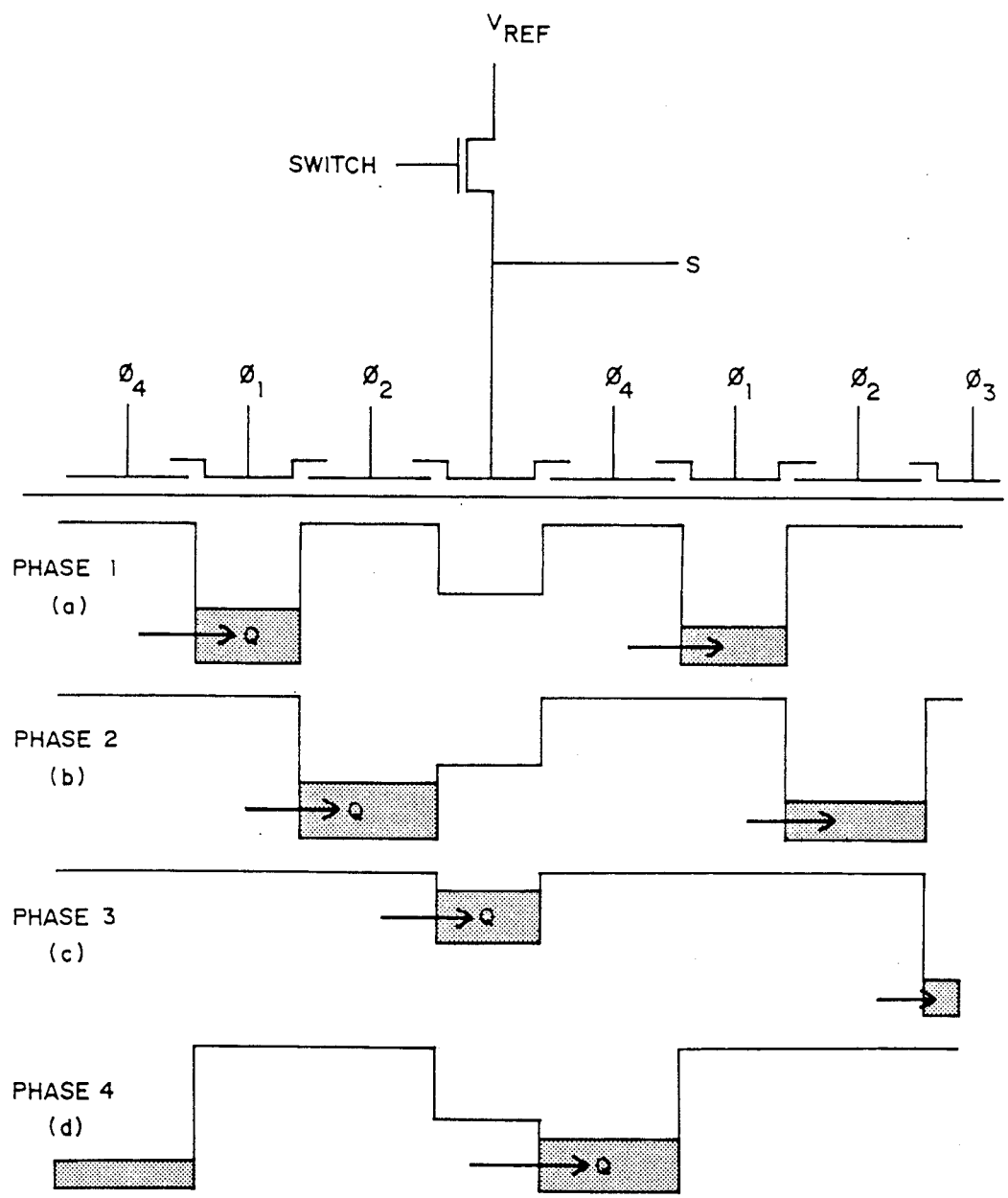
FIG. 1 is a schematic representation of the electrode configuration used in the present invention for nondestructive sensing of a charge packet and includes an electron potential graphical illustrations (a) to (d) showing the electron potential distribution in a fourphase embodiment.

Referring first to FIG. 1 herein, it will be understood that the illustrated charge domain device constitutes a four phase charge coupled device in which charge passes from left to right by sequentially pulsing electrodes $\phi_1$, $\phi_2$, $\phi_3$ and $\phi_4$ with the proper timing and phase as is generally well-known in the CCD art. It will also be understood that the present invention is not limited to four-phase CCD operation. In fact, the invention can be implemented in any CCD configuration. As illustrated in FIG. 1, there is a floating electrode between the electrodes $\phi_2$ and $\phi_4$. This floating electrode is labelled "S" and is common to all the accompanying figures. In the CCD structure of FIG. 1, the floating electrode S senses the charge Q passing underneath it and the potential or voltage of the floating electrode gate changes proportionally to the size of the charge packet beneath it. This potential change also appears on the "fill and spill" portion of the CCD structure, shown in FIGS. 2 and 3, where it modifies the height of a potential barrier.

Thus the height of the barrier beneath floating electrode S in the "fill and spill" circuits is proportional to the charge Q sensed by the left portion of electrode S and constitutes a charge sensing process which is accomplished non-destructively, that is, without dissipating the charge.

The initial step of the procedure is to nondestructively sense the charge packet moving in a standard CCD structure. The sensing circuit consists of a normal CCD (FIG. 1) with a special electrode substituted for $\phi_3$. This special electrode, denoted S, acts as a DC gate—i.e., it is not clocked like the rest of the $\phi_1$, $\phi_3$, $\phi_3$ and $\phi_4$ CCD phases. The S electrode is connected to a reference voltage (Vref) through a switch which is used to precharge the electrode during phase 1. (Phase 1 is used in a timing sense here—it refers to the time at which the charge Q is beneath the $\phi_1$ electrode.) The S electrode is charged to a voltage (Vref) that is roughly in the middle of the high and low clock phase voltages, as shown in the Phase graph of FIG. 1(a). During phase 2, the charge is moved from underneath the $\phi_1$ electrode to the $\phi_2$ electrode and stopped from continuing by the mid-range voltage of the S electrode (FIG. 1(b). Going from phase 2 to phase 3 (of the timing), the potential on the $\phi_2$ electrode is lowered, transferring the charge Q underneath the S electrode, shown in FIG. 1(c). The low potential on the $\phi_4$ electrode prevents the charge from continuing past the S electrode. The charge packet Q induces a voltage change in the S electrode, proportional to the size of the charge packet according to the well known equation:

$$\Delta V = Q_{charge}/C_s k$$

During phase 4 of the timing, the $\phi_4$ electrode is pulsed high, creating a deep well and causing the charge packet to move from underneath the S electrode to the $\phi_4$ electrode. The cycle then repeats, with the S electrode being reset to Vref and a new charge packet coming from the left. The entire process is nondestructive—the charge packet is sensed (creating a voltage change on the S electrode) but not dissipated.

Figure 2:
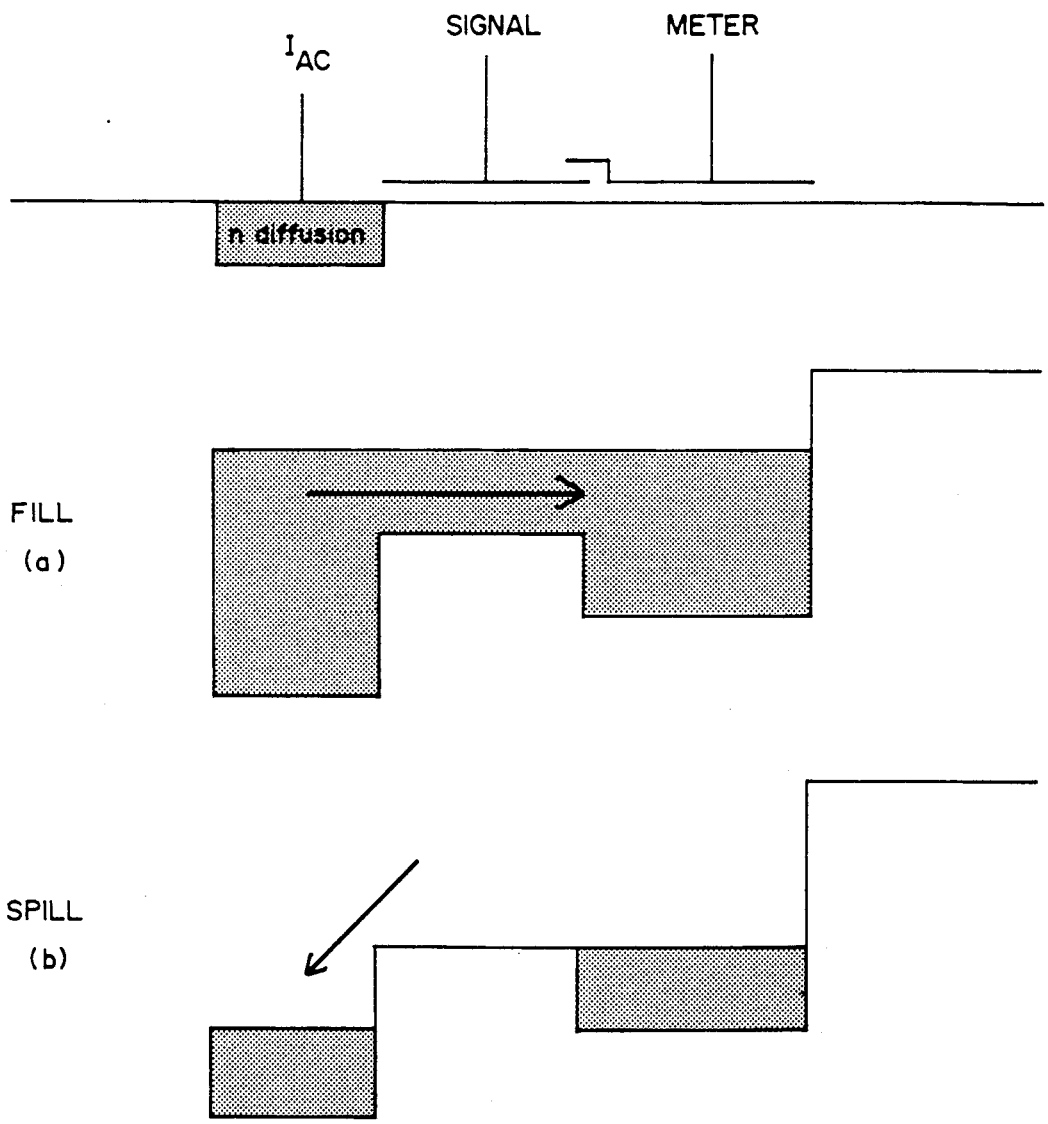
FIG. 2 is a schematic representation of the standard fill and spill procedure including electron potential graphical illustrations (a) and (b)

The transition from charge domain to voltage domain signals (above) has a symmetrical counterpart for transforming voltages into charge packets. The essential characteristics are shown in FIG. 2. The circuit consists of a weakly doped n diffused region which is connected to an AC current source ($I_{ac}$), a signal gate labelled "S", and a DC metering gate. The signal gate voltage "S" controls the size of the charge packet to be created. The operation begins wtih the fill phase where $I_{ac}$ is pulsed to allow voltage to cause electrons to flow into the diffused region and fill underneath the gates, shown in FIG. 2(a). During the next phase (the spill phase) the current is reversed, drawing electrons out of the diffusion, causing part of the charge to become trapped under the metering gate through potential equilibration. Note that the height of the spill barrier is determined by the voltage of the signal gate "S". Thus the charge packet under the meter gate is proportional to the S electrode voltage. (Higher signal voltage givs a smaller charge packet.)

The above processes are well known and used by CCD designers regularly to sense and create charge packets. The next step, (the multiplication), is however, believed to be entirely new.

The present invention involves a modification of the "fill and spill" circuit shown in FIG. 2. The DC Meter gate of FIG. 2 is replaced by two or more closely spaced electrodes which are controlled by a set of externally applied voltages $V_1, ..., V_n$ where n is the number of meter electrodes. By modifying the potentials on these two or more electrodes, the "width" of the potential well created by the sensed charge, is modulated as indicated by the shaded area beneath the ($V_1, ..., V_n$) electrodes. The size of the potential well is the product of the barrier height (which is proportional to the sensed charge) and width (controlled by $V_1, ..., V_n$). This newly created potential well is proportional in size to the desired product and is filled with charge via a diffusion connected to $I_{AC}$. The filling procedure is an application of a the well-known "Fill and Spill" technique. Thus, combining the non-destructive sense circuit and the multiple metering gate circuit provides a circuit, shown in FIG. 4, in which a new charge packet is created which is proportional in size to the product of a non-destructively sensed charge packet and an externally applied voltage.

The actual voltage applied to each of the potential well "width" control electrodes and, for that matter, the number of such electrodes may vary. The greater the number of such electrodes, the greater is the degree of "width" control.

In the "Fill and Spill" technique shown in its most basic form in FIG. 2, the signal voltage "S" controls the height of the potential barrier. The size of the created charge packet is proportional to the area beneath the meter gate, bounded by the height of the potential barrier and the width of the meter electrode. Ideally the width should be modulated to achieve multiplication so that the area (i.e. the size of the created charge packet) can be controlled in both dimensions.

Figure 3:
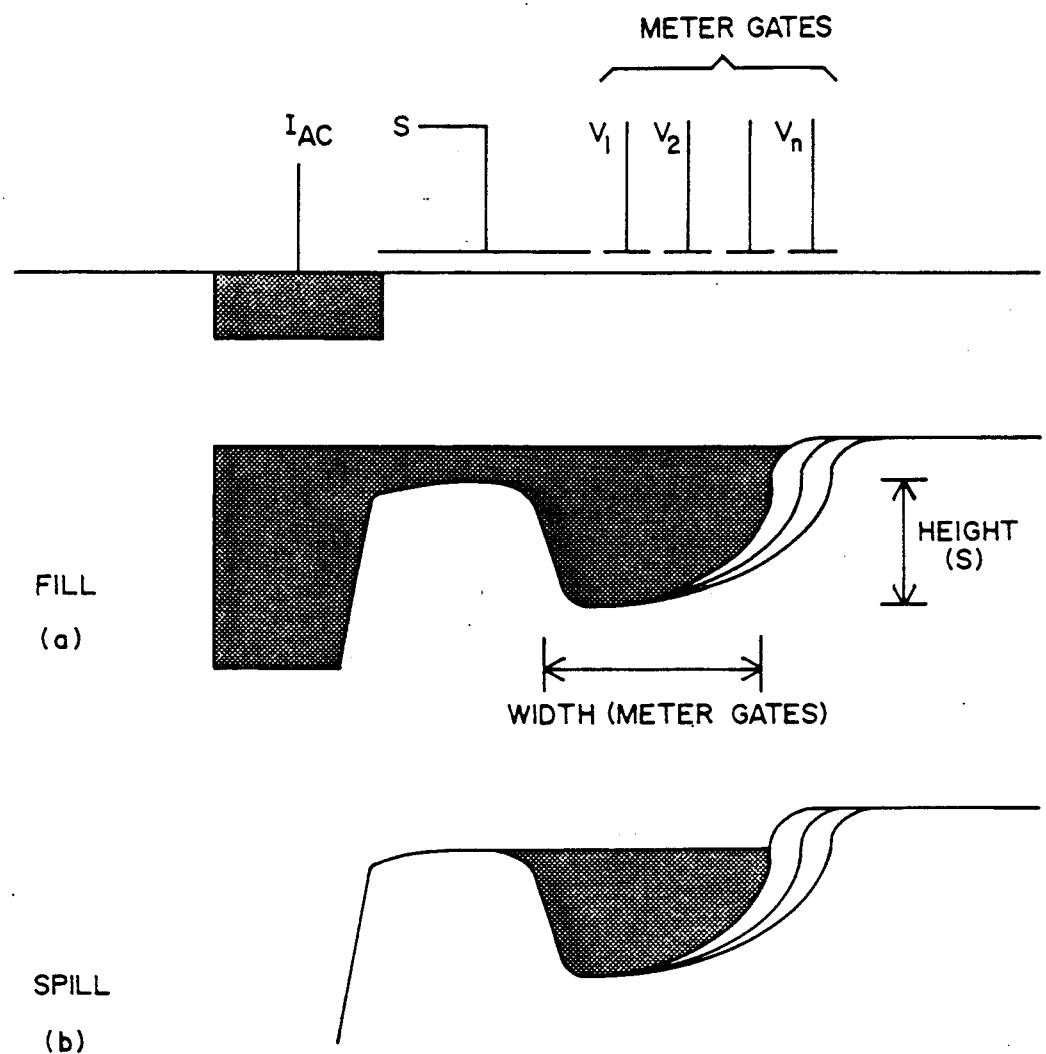
FIG. 3 is a schematic representation of the fill and spill procedure in a multiplication circuit implementation according to the present invention including electron potential graphical illustrations (a) and (b)

An easy way to achieve width modification is by breaking the meter gate into a number (greater than or equal to two) of smaller gates, shown in FIG. 3. Since buried channel CCD's run beneath the surface of the silicon away from the gates, the potential is not what is typically drawn in schematics (as in FIGS. 1 and 2) but actually a continuously varying spatial function. The smaller the gates, the more pronounced the deviation from typical schematics. Thus by breaking the meter gate into a plurality of smaller gates, the potential profile beneath the electrodes becomes programmably non-linear.

The potential profile can be tailored to provide a deterministic nonlinearity to the "Fill and Spill" procedure. By providing the proper signals at the meter control gates, a potential profile can be built, shown in FIG. 3, that approximates a variable width well. The control voltages used for the meter gates are generated externally with a circuit (not shown) that implements mapping from a logical multiplicand to physical voltages.

The approximation to a variable width well is compensated for by a single external mapping circuit, easily realized with conventional circuitry.

Figure 4:
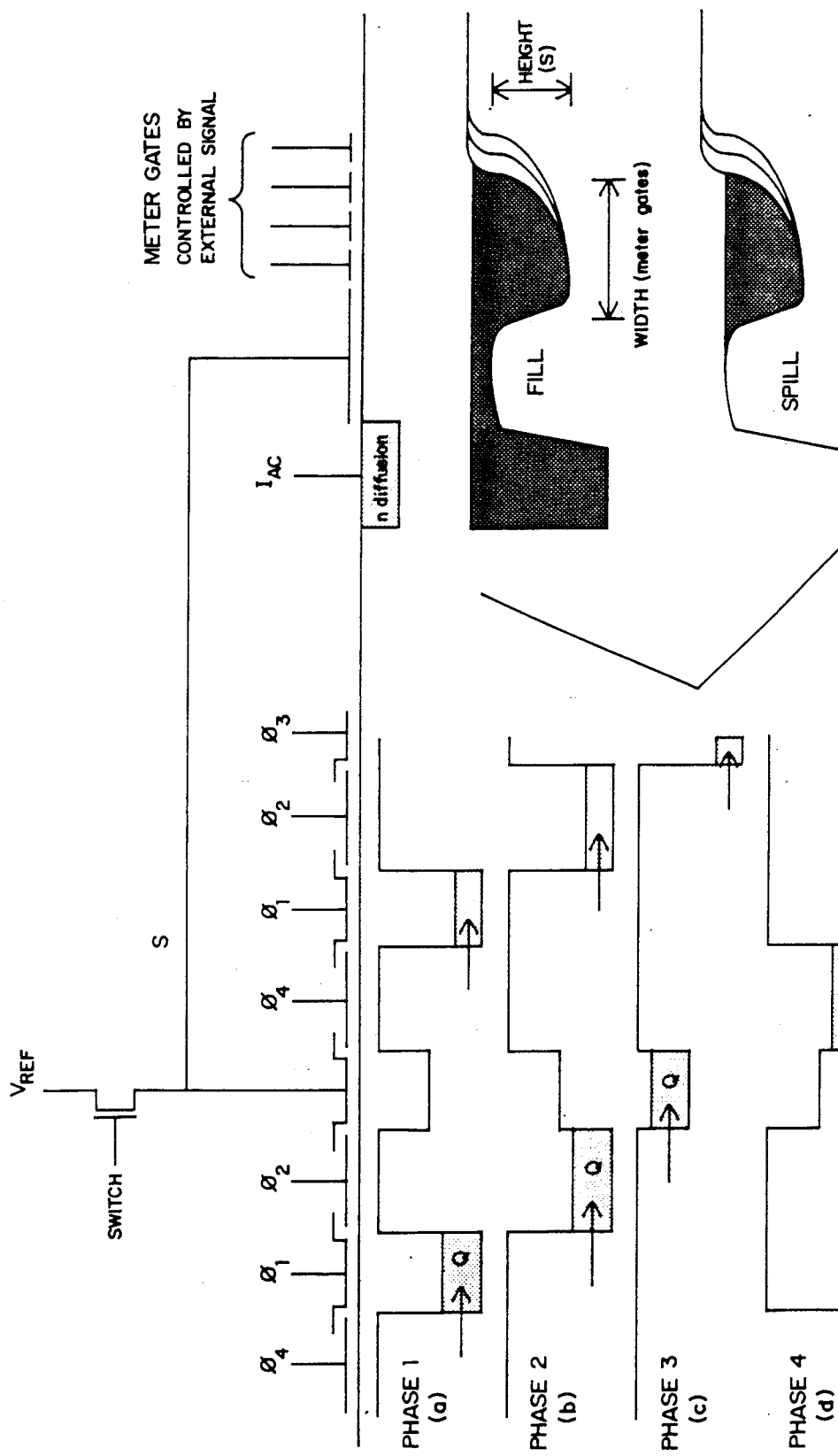
FIG. 4 is a schematic representation of the entire non-destructive charge domain multiplier which includes elements of FIGS. 1 and 3.

In order to obtain a non1estructive multiplier, the voltage sensed by the nondestructive sense circuit (FIG. 1) is used as the signal voltage in the "Fill and Spill" circuit modified for multiple gate metering (FIG. 3) creating the circuit of FIG. 4. The necessity of external signal generation (for the metering gates) makes the circuit especially practical for large parallel systems in which many multipliers need the same value (such as neural networks).

It will now be understood that what has been disclosed herein comprises a circuit and method to implement a nondestructive charge domain multiplier. The invention lies in the use of multiple metering gates which create a spatially varying potential along the channel which effectively controls the width (or length) of the "Fill and Spill" charge region. The height is controlled by the voltage change on a sense electrode (S), thus resulting in a charge packet proportional to the product of the sense charge packet and an externally generated value.

Those having skill in the art to which the present invention pertains will now, as a result of the applicants' teaching herein, perceive various modifications and additions that may be made to the invention. By way of example, the precise number of metering gates and the voltage characteristics applied thereto to control the multiplicative well width and shape may be readily varied in accordance with the desired application. Furthermore, the voltages applied to the disclosed plurality of metering gates may be in a modified binary format. Accordingly, all such modifications and additions are deemed to be with the scope of the invention which is to be limited only by the claims appended hereto.

We claim:

1. A semiconductor charge domain device of the type in which charge packets proportional to analog values are spatially transferred between electron potential wells along a channel buried beneath an array of charge transfer electrodes, the transfer of the charge packets being controlled by the magnitude and timing of voltages applied to the transfer electrodes; the device comprising:

at least one such electrode being in a floating mode wherein said floating electrode is selectively disconnected from any source of voltage and the voltage on said floating electrode is determined by the magnitude of a charge packet passing beneath and sensed by said floating electrode;

said floating electrode being positioned adjacent said buried channel at at least two discrete and spaced apart locations, a first such location being among said transfer electrodes and a second such location being spaced therefrom along said buried channel, the depth of the electron potential well beneath said second location being proportional to the voltage on said floating electrode;

a source of charge positioned in said channel immediately adjacent said second contact location of said floating electrode; and means for modifying the width of an electron potential well adjacent said location whereby the amount of charge therein after potential equilibration is proportional to said floating electrode-sensed charge packet and said width-modifying means.

2. The device recited in claim 1 wherein said modifying means comprises a plurality of metering gates having respective voltages applied thereto for creating a non-linear electron potential well beneath said gates.

3. The device recited in claim 1 wherein said modifying means comprises a plurality of metering gates having respective voltages applied thereto in a continuously variable spatial function from metering gate to metering gate.

4. A charge-coupled device having a plurality of adjacent electrically isolated electrodes, each such electrode being provided with a voltage, the respective voltages on said plurality of electrodes being selected to create a continuous non-linear potential profile beneath said electrodes and means for controlling the relative height of said potential profile in accordance with a sensed charge.

5. The charge-coupled device recited in claim 4 wherein said controlling means comprises a floating electrode in contact with said charge-coupled device at at least two discrete and space-apart locations, a first such location being above the charge to be sensed and a second such location being adjacent said electrically isolated electrodes.

6. The charge-coupled device recited in claim 5 further comprising a source of charge adjacent said .. second location of said floating electrode.

7. A method of generating a charge region in a charge-coupled device wherein the height of the charge region is proportional to a sensed charge and the width of the charge region is proportional to an externally applied value; the method comprising the steps of (a) sensing said charge with a floating electrode positioned at two locations on said device; a first such location being above the charge to be sensed and a second such location being adjacent said charge region;

(b) providing a source of charge adjacent said second floating electrode location; and (c) controlling the width of said charge region in accordance with said externally applied value by applying programmed spatially non-linear voltages to respective ones of a plurality of metering gate electrodes above said charge region.

8. The method recited in claim 7 further comprising the steps of filling said charge regions with charge from said source using the "Fill and Spill" procedure whereby the charge in said filled charge region is proportional to the product of said sensed charge and the externally applied value.

9. The method recited in claim 7 wherein said programmed spatially non-linear voltages are binary voltages.

* * * * *